United States Patent [19]
Ishio et al.

[11] Patent Number: 5,869,876
[45] Date of Patent: Feb. 9, 1999

[54] SEMICONDUCTOR STRAIN SENSOR

[75] Inventors: Seiichiro Ishio, Handa; Kenichi Ao, Yokai; Hiroshige Sugito, Nagoya, all of Japan

[73] Assignee: Denso Corporation, Kariya, Japan

[21] Appl. No.: 788,169

[22] Filed: Jan. 24, 1997

[30] Foreign Application Priority Data

Jan. 26, 1996 [JP] Japan .................................... 8-011623

[51] Int. Cl.⁶ ........................... H01L 29/82; H01L 27/20; H01L 29/84
[52] U.S. Cl. ........................ 257/419; 257/254; 257/415; 257/417; 257/418; 438/50; 438/53
[58] Field of Search .................. 257/254, 415, 257/417–418; 438/50, 52, 53

[56] References Cited

U.S. PATENT DOCUMENTS

| | | | |
|---|---|---|---|
| 4,706,374 | 11/1987 | Murakami . | |
| 5,283,459 | 2/1994 | Hirano et al. | 257/419 |
| 5,296,730 | 3/1994 | Takano et al. | 257/417 |
| 5,397,911 | 3/1995 | Hiyama et al. | 257/415 |
| 5,514,898 | 5/1996 | Hartauer | 257/417 |
| 5,549,785 | 8/1996 | Sakai et al. . | |
| 5,614,753 | 3/1997 | Uchikoshi et al. | 257/417 |

FOREIGN PATENT DOCUMENTS

| | | |
|---|---|---|
| 588 371 | 3/1994 | European Pat. Off. . |
| 6-318586 | 11/1994 | Japan . |

*Primary Examiner*—Mahshid D. Saadat
*Assistant Examiner*—Allan R. Wilson
*Attorney, Agent, or Firm*—Pillsbury Madison & Sutro LLP

[57] ABSTRACT

A semiconductor strain sensor has a gauge forming region on a p-type substrate surrounded by a p-type isolation region that reaches the p-type substrate. The p-type substrate is etched so that the entire bottom surface of the gauge forming region is covered by the p-type substrate, and the p-type substrate or p-type isolation region is not exposed to the etched recess portion or isolation groove, each of which have a relatively high number of defects. Thus, leakage current at the PN junction can be decreased to decrease a variation in the potential of the gauge forming region.

5 Claims, 6 Drawing Sheets

SEMICONDUCTOR STRAIN SENSOR

CROSS REFERENCE TO RELATED APPLICATION

This application is based upon and claims priority from Japanese Patent Application No. Hei. 8-11623 filed Jan. 26, 1996, the contents of which are incorporated herein by reference.

BACKGROUND OF THE INVENTION

1. Field of the Invention

The present invention relates to a semiconductor strain sensor such as a semiconductor acceleration sensor having a beam, and a method for producing the same.

2. Description of the Related Art

Japanese Patent Application Laid-Open Publication No. 6-97465 filed by the present applicant discloses a semiconductor acceleration sensor. The method for producing this semiconductor acceleration sensor is as follows. First, a first conductivity type semiconductor substrate having a second conductivity type epitaxial layer in the surface thereof is prepared. A semiconductor substrate that is located right beneath a predetermined region of the second conductivity type epitaxial layer is electrochemically etched from a reverse side thereof to thereby form a groove. Further, a predetermined region of the thinned portion which has been thinned by the formation of the groove is subjected to dry etching from the epitaxial layer side to thereby form isolation grooves. A cantilever beam is formed owing to these isolation grooves.

In the semiconductor acceleration sensor produced by the above-mentioned conventional method, in order to decrease adverse effects such as noise, it is usual to apply a reverse bias voltage to the PN junction between the second conductivity type epitaxial layer having the first conductivity type gauge portion formed therein and the first conductivity type semiconductor substrate.

However, in the semiconductor strain sensor that has been produced using the above-mentioned method, since the PN junction between the second conductivity type epitaxial layer having the first conductivity type gauge region formed therein and the first conductivity type semiconductor substrate is exposed to the relatively stained side surface (etched surface) of the beam portion or mass portion, there is the drawback that the junction leakage current flows inconveniently through this exposed portion of the PN junction. Especially, in a case where the beam portion is formed by dry etching, the side surface of the beam portion that is exposed as a result of etching is in an atomically very disorderly state and hence in a state where the junction leakage current tends to easily flow therethrough. Accordingly, the use of the conventional method results in large fluctuations or variations in the junction leakage current in the interior of the second conductivity type beam portion. For this reason, the potentials at the respective portions in the second conductivity type epitaxial layer that are located in the beam portion fluctuate. This potential fluctuation causes the fluctuation in the potential in the first conductivity gauge portion, or the occurrence of noise in the first conductivity type gauge portion through the leakage resistance or electrostatic capacitance between the second conductivity type epitaxial layer and the first conductivity type gauge portion.

SUMMARY OF THE INVENTION

The present invention has been made in view of the above-mentioned problems and its object is to provide a semiconductor strain sensor wherein decrease is made of the leakage current at the PN junction between the second conductivity type semiconductor region having the first conductivity type gauge portion formed therein and the first conductivity type semiconductor substrate to thereby decrease the fluctuation in the output potential of, or the noise from, the gauge portion, and a method for producing the same.

To attain the above object, according to a preferred embodiment of the present invention, a thin gauge forming region which has a first conductivity type gauge portion formed therein and which is composed of part of a second conductivity type semiconductor region has its entire peripheral side surface surrounded by a first conductivity type isolation region that reaches to a first conductivity type semiconductor substrate. Further, the entire bottom surface of the thin gauge forming region is brought into contact with the first conductivity type semiconductor substrate. Therefore, the PN junction between the gauge forming region and the first conductivity type semiconductor substrate or first conductivity type isolation region can be prevented from being exposed to the surface of the etched recess portion or isolation grooves which have comparatively many defects. This decreases the leakage current at the PN junction to thereby cause the decrease in the variation of the potential of the gauge forming region and as a result, decreases the variation of the potential at the first conductivity type gauge portion or noise.

BRIEF DESCRIPTION OF THE DRAWINGS

These and other objects, features and charateristics of the present invention will be appreciated from a study of the following detailed description, the appended claims, and drawings, all of which form a part of this application. In the drawings:

DETAILED DESCRIPTION OF THE PREFERRED EMBODIMENTS

An embodiment of a semiconductor acceleration sensor according to the present invention will now be described with reference to the accompanying drawings.

Figure 1:
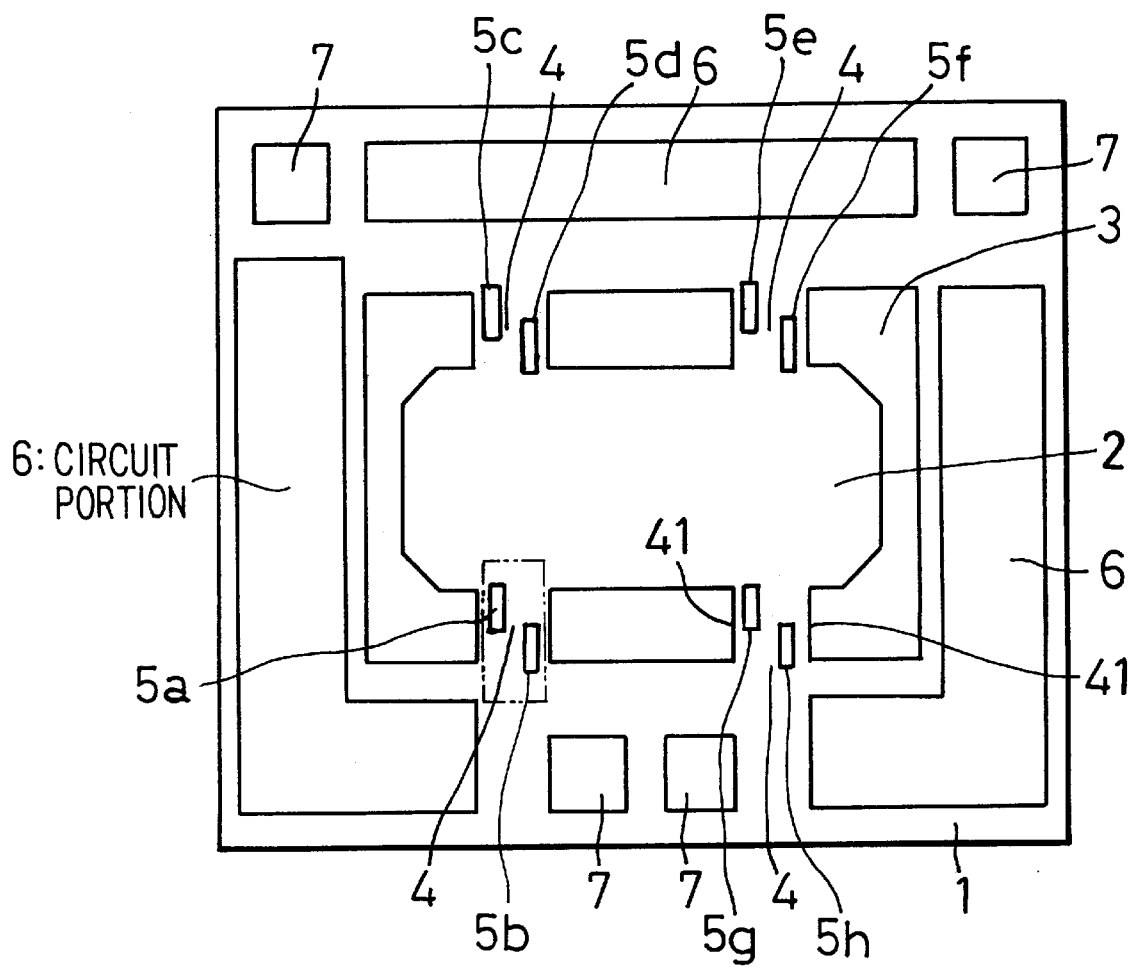
FIG. 1 is a typical plan view illustrating a semiconductor acceleration sensor according to a first embodiment of the present invention.
Figure 2:
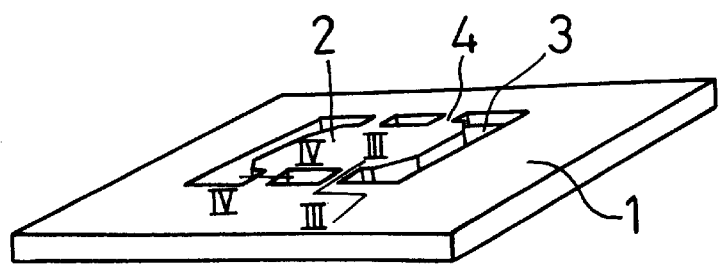
FIG. 2 is a perspective view illustrating the semiconductor acceleration sensor that is illustrated in FIG. 1.

FIG. 1 is a plan view illustrating this semiconductor acceleration sensor, FIG. 2 is a perspective view illustrating the same, and FIGS. 3, 4 and 6 to 11 illustrate the production steps for producing the same.

Figure 3:
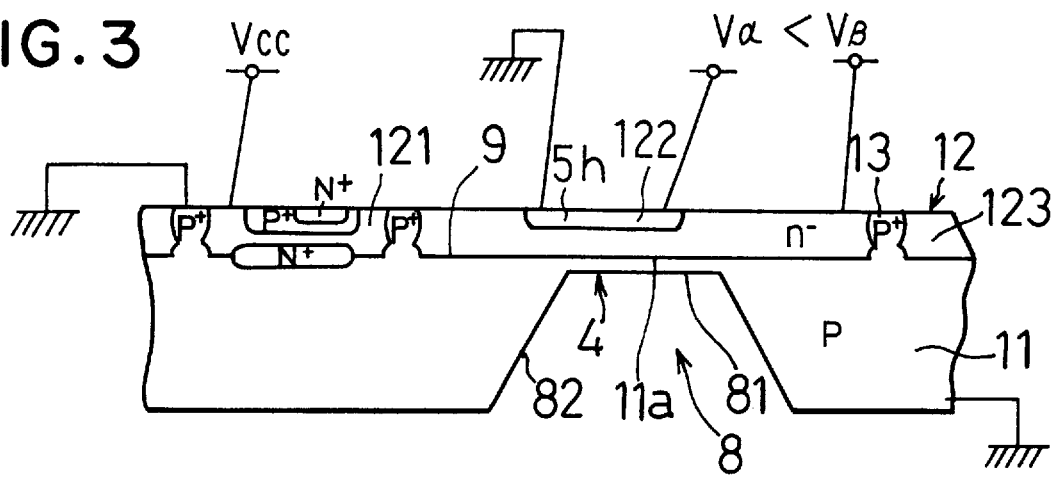
FIG. 3 is a sectional view taken along the line III—III of FIG. 2, illustrating a step of producing the semiconductor acceleration sensor illustrated in FIG. 1.
Figure 4:
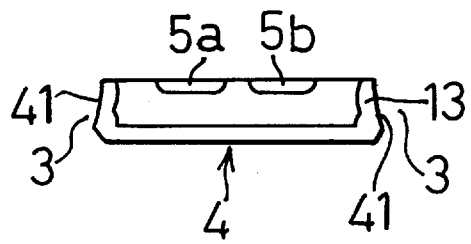
FIG. 4 is a sectional view taken along the line IV—IV of FIG. 2, illustrating a step of producing the semiconductor acceleration sensor illustrated in FIG. 1.

In FIGS. 1 and 2, a semiconductor acceleration sensor formed in a silicon chip comprises a main portion 1, a mass portion 2, isolation grooves 3 for isolating the mass portion 2 from the main portion 1, and four beam portions (thinned portions) 4 for connecting the main portion 1 and the mass portion 2. In the beam portions 4 there are formed p-type gauge portions 5a to 5h each of which is composed of a piezo resistor region provided by diffusing a p-type impurity in the beam portions 4 in such a manner that each p-type gauge portion extends along the isolation grooves 3 that are located on both sides of the beam portions 4. The respective p-type gauge portions 5a to 5h are connected to one another by wiring (not illustrated), each of which consists of, for example, a high concentration p-type region, to thereby construct a bridge circuit. The output signal voltage of this bridge circuit is amplified and processed in a circuit portion 6 (the amplifier portion that is so referred to in the present invention) formed in the main portion 1. A reference numeral 7 represents bonding pads. A section taken along a line III—III of FIG. 2 is illustrated in FIG. 3 and a section taken along a line IV—IV thereof is illustrated in FIG. 4. Namely, FIG. 3 illustrates the section that has been taken in the longitudinal direction (the III—III direction) of the beam portion 4 and FIG. 4 illustrates the section that has been taken in the width direction (the IV—IV direction) of the beam portion 4.

In FIG. 3, on the surface of the p-type substrate 11 there is formed a n⁻ layer (n-type layer) 12. In the n⁻ layer 12 there are formed p⁺ isolation regions 13 (p-type isolation regions) that extend dawn to the p-type substrate 11 so as to serve as element isolation regions. The p⁺ isolation region 13 insulates and isolates a plurality of active regions (only one piece is illustrated in FIG. 3) 121 and gauge forming regions 122 from the remaining portion 123 of the n⁻ layer 12. In each of the active regions 121 there is integrated a signal processing circuit that includes an amplifier formed from a plurality of bipolar transistors and resistance elements and a power source circuit supplying a constant voltage thereto, etc. Beneath the gauge forming regions 122 there are formed the beam portions 4 and, in the surface portions thereof, there are formed the above-mentioned p-type gauge regions (p-type gauge portions) 5a to 5h. In FIG. 1, there is illustrated the range of a single gauge forming region in a two-dot chain line. It is to be noted that the respective gauge forming regions 122 may be made integrally continuous with one another through the n⁻ layer 12 of the mass portion 2.

A reference symbol 8 represents a recess portion which, in order to thin the p-type substrate 11 so as to form the beam portion 4, has been formed by performing electrochemical etching (anisotropic etching) of the p-type substrate 11. This recess portion 8 is communicated with the isolation grooves 3 on both sides thereof.

One of the important points of this embodiment is that the thinned p-type substrate 11 (hereinafter referred to also as "p-type bottom portion 11a") is interposed between a bottom surface 81 of the recess portion 8 and the n⁻ type gauge forming region 122. Another one of the important points of this embodiment is that the p-type isolation region 13 that surrounds the gauge forming region 122 insulates and isolates the gauge forming region 122 from the active regions 121 and remaining portions 123 that are the other regions and portion of the n⁻ layer, and also isolates it from the side surface of the beam portion 4, i.e., the surface 41 thereof that faces the isolation groove 3, as shown in FIG. 4.

Accordingly, it results from the above that the gauge forming region 122 in this embodiment has its side surfaces and bottom surface surrounded entirely by the p⁺ isolation region 13 and p-type substrate 11. As a result, a PN junction 9 between the gauge forming region 122 and p-type substrate 11 is not exposed to the etching surfaces that have relatively degraded characteristics, i.e., the bottom surface 81 and side surfaces 82 of the recess portion 8 and the side surfaces 41 of the beam portion 4. For this reason, it is possible to cause a remarkable decrease in the leakage current of this PN junction 9 at the time of application of a reverse bias voltage thereto as compared to the conventional device.

Further, in this embodiment, the p-type substrate 11 is grounded and the active region 121 has a positive potential (e.g., power source voltage) applied thereto, whereby electrical separation is made between the p-type substrate 11 and the active region 121. Also, to predetermined end portions of the p-type gauge portions 5a to 5h that constitute a maximum potential direct current input end of the bridge circuit there is applied a positive potential and, to the gauge forming region 122, there is applied a potential that is higher by the barrier potential than that which is applied to the maximum potential end of the p-type gauge portions 5a to 5h. It is of course also possible to apply to the gauge forming region 122 a predetermined direct current voltage that is not forward biased with respect to the p-type gauge portions 5a to 5h. Under such potential conditions, the distortion of the beam portion 4 due to acceleration is detected by way of the variation in the resistance value of the p-type gauge portions 5a to 5h and is amplified by the circuit portions 6. This is well known and therefore no further explanation thereof is made herein.

As described above, in this embodiment, since the leakage current of the PN junction 9 is decreased, there occurs a decrease in the variation and fluctuation of the voltage drop caused by the resistance inside the gauge forming region 122 that occur due to the variation and fluctuation in this leakage current. As a result of this, the fluctuation in the potential of the gauge forming region 122 can be prevented from having an electrostatic effect on the p-type gauge portion 5 and thereby causing the fluctuation in the resistance characteristic thereof and causing the variation in the SN ratio or characteristic of the signal voltage thereof.

Figure 5:
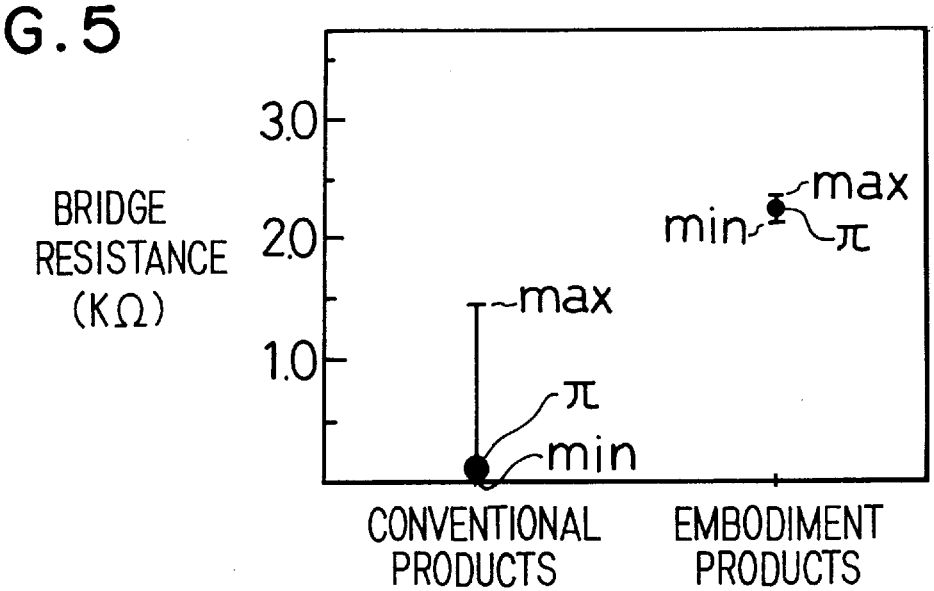
FIG. 5 is a graph illustrating the resistance variations that occur in conventional products and in embodiment products, respectively.

FIG. 5 illustrates the variations in the bridge resistances which occur both in fifty conventional products and in fifty embodiment products. It is to be noted that the "bridge resistance" means a total resistance that is obtained when the resistors of the p-type gauge portions 5a to 5h have been formed as a bridge circuit. The "conventional products" each mean the product of a configuration wherein the bottom surface of the gauge forming region 122 the recess portion 8 is exposed as the bottom surface 81 of the recess portion 8 and the side surfaces of the gauge forming region 122 also is exposed as the side surfaces 41 of the beam portion 4.

Next, the method for producing this semiconductor acceleration sensor will now be explained with reference to FIGS. 3, 4, and 6 to 14.

Figure 6:
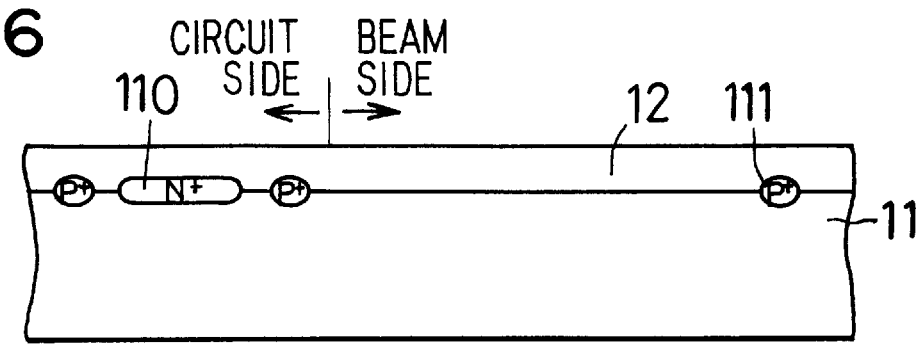
FIG. 6 is a sectional view taken along the line III—III of FIG. 2, illustrating a step of producing the semiconductor acceleration sensor illustrated in FIG. 1.
Figure 7:
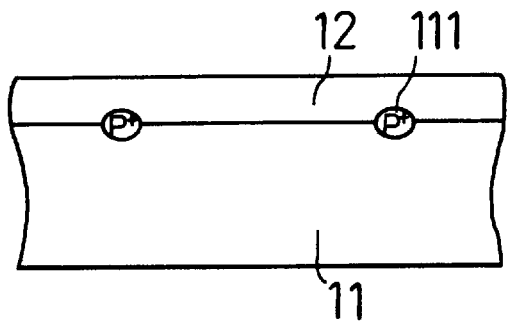
FIG. 7 is a sectional view taken along the line IV—IV of FIG. 2, illustrating a step of producing the semiconductor acceleration sensor illustrated in FIG. 1.

First, as illustrated in FIGS. 6 and 7, in the surface of the p-type substrate (the semiconductor substrate that is so referred to in the present invention) 11 whose plane direction is (100), there are doped a $n^+$ buried collector region 110 and a $p^+$ buried region 111. On the resulting surface thereof, there is formed a $n^-$ type epitaxial layer 12.

Figure 8:
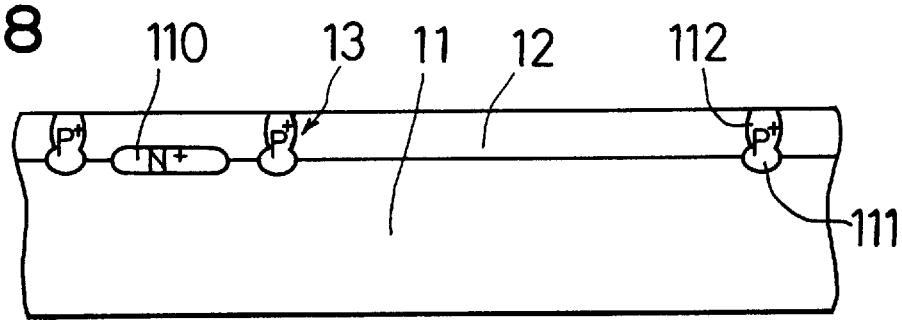
FIG. 8 is a sectional view taken along the line III—III of FIG. 2, illustrating a step of producing the semiconductor acceleration sensor illustrated in FIG. 1.
Figure 9:
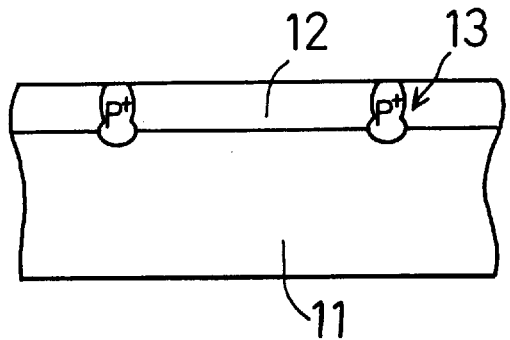
FIG. 9 is a sectional view taken along the line IV—IV of FIG. 2, illustrating a step of producing the semiconductor acceleration sensor illustrated in FIG. 1.

Next, as illustrated in FIGS. 8 and 9, a $p^+$ surface region 112 is formed until it reaches the $p^+$ buried region 111, whereby the $p^+$ isolation region 13 is formed using the $p^+$ surface region 112 and $p^+$ buried region 111.

Figure 14:
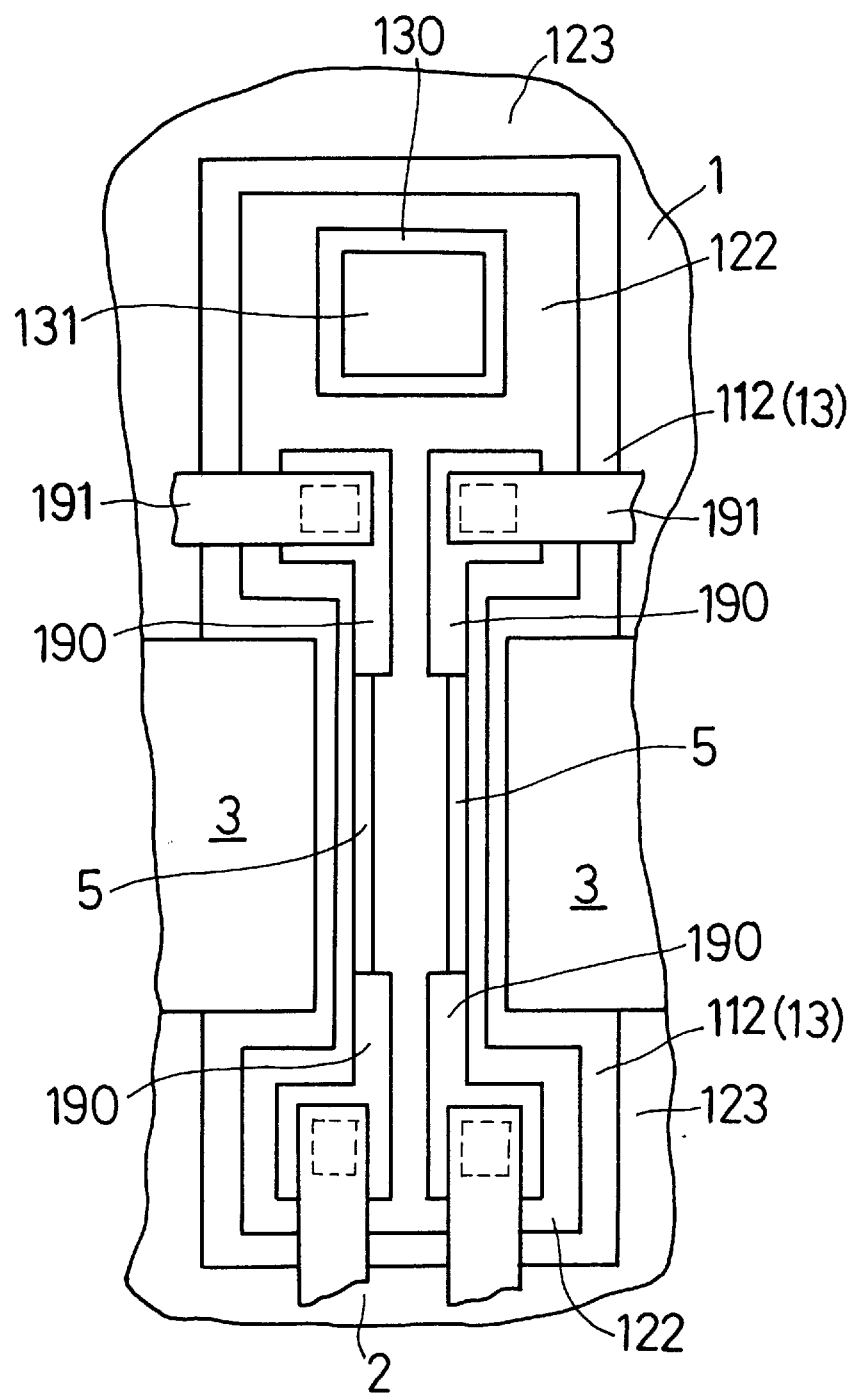
FIG. 14 is a typical plan view illustrating a modification of the sensor according to the first embodiment.

It is to be noted that, as illustrated in FIG. 14, it is also possible to form $p^+$ wiring regions 190 that function as wiring from both ends of each of the p-type gauge portions 5, simultaneously with the formation of the $p^+$ surface region 112. When the both ends of the p-type gauge portion 5 formed in the surface portion of the thin beam portion 4 are connected to each other by a metal wiring layer or polysilicon wiring layer that has been formed on an insulation film of the beam portion 4, the existence or characteristic of this layer affects the distortion characteristic of the p-type gauge portion 5. On this account, if from the thin beam portion 4 to the thick main portion 1 or mass portion 2 there are extended the wiring regions 190 which are then connected to low-resistance wiring 191 at the positions that are situated over the main portion 1 or mass portion 2, the above-mentioned problems can be solved and the burden of adding an additional step to the process can be avoided.

Figure 10:
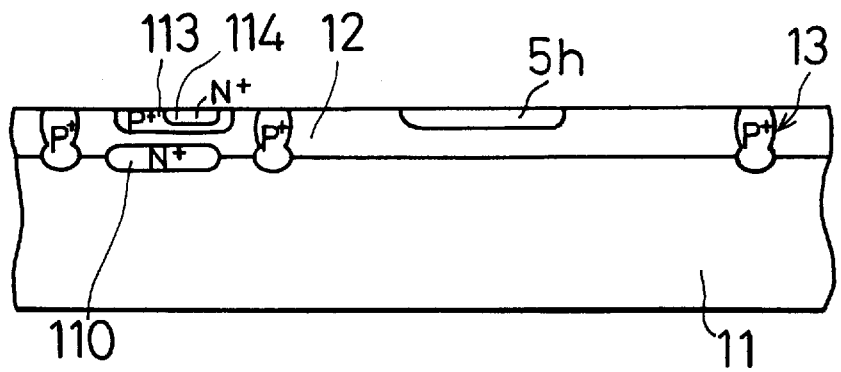
FIG. 10 is a sectional view taken along the line III—III of FIG. 2, illustrating a step of producing the semiconductor acceleration sensor illustrated in FIG. 1.
Figure 11:
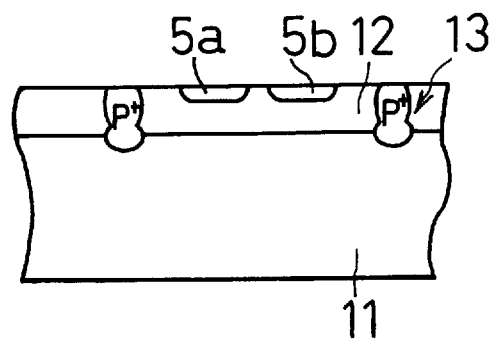
FIG. 11 is a sectional view taken along the line IV—IV of FIG. 2, illustrating a step of producing the semiconductor acceleration sensor illustrated in FIG. 1.

Next, as illustrated in FIGS. 10 and 11, the p-type base region 113 of a bipolar transistor are formed within the active region 121 and the p-type gauge regions (p-type gauge portions) 5a to 5h are simultaneously formed with the p-type base region 113 through the same process step. Thereafter, the $n^+$ emitter region 114 thereof, aluminum wiring and aluminum bonding pads 7 are formed sequentially. Further, a protective oxide film (not illustrated) is formed, whereby the execution of the elements formation steps is terminated.

It is to be noted that, as illustrated in FIG. 14, in order to ensure excellent ohmic contact with the $n^-$ layer 12 and reliably impart a potential to the gauge forming region 122 and remaining portion 123 that form a part of the $n^-$ layer 12, it is preferable to form an $n^+$ contact region 130 previously in the surface portion of the gauge forming region 122 and remaining portion 123 at the electrochemical etching time.

Next, a silicon oxide film (not illustrated) on the $n^-$ layer 12 (especially the $n^+$ contact region 130) is selectively made open and an aluminum bonding pad 131 is formed thereover. Thereafter, a protective insulation film is formed in such a manner as to cover the pad 131 and then this protective insulation film is selectively made open to thereby expose the pad 131. Since the formation step for forming this pad 131 is executed through the same process step as the formation step for forming the aluminum wiring or aluminum bonding pads 7, no additional step is provided.

Figure 12:
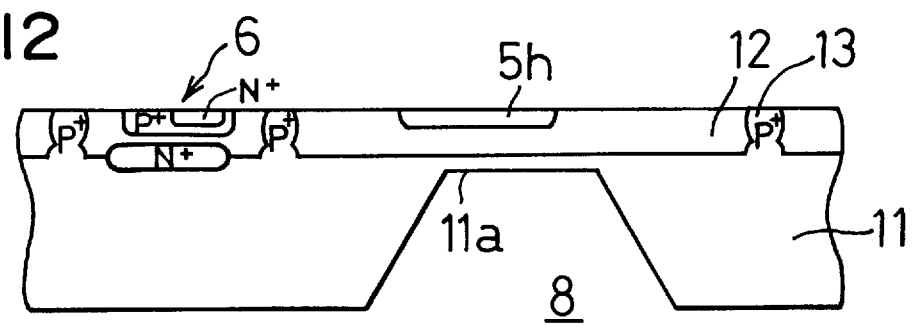
FIG. 12 is a sectional view taken along the line III—III of FIG. 2, illustrating a step of producing the semiconductor acceleration sensor illustrated in FIG. 1.
Figure 13:
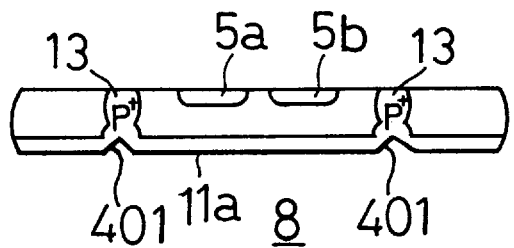
FIG. 13 is a sectional view taken along the line IV—IV of FIG. 2, illustrating a step of producing the semiconductor acceleration sensor illustrated in FIG. 1.

Next, the recess portion 8 that is illustrated in FIGS. 12 and 13 is formed by electrochemical etching. That is, although not illustrated, a plasma nitride film (P—SiN) is formed on the reverse main surface of the wafer, whereby this plasma nitride film is photo-patterned to thereby form an etching mask. Next, a resist film is spin-coated also on the obverse main surface of the wafer, whereby the pads 131 are exposed by photo-patterning. It is to be noted that as the resist film there is used a PIQ film.

Next, by immersing the reverse main surface of the wafer in an alkaline etching solution such as an aqueous solution of KOH and causing the wafer to face a platinum electrode plate and applying to the pads 131 formed on the main surface of the wafer a predetermined positive voltage (e.g., 5 V) with respect to the platinum electrode plate, a so-called "electrochemical etching" is performed. As a result, the anisotropic recess portion 8 is formed.

It is to be noted that the important point of this embodiment is that a reverse bias voltage of several volts is ensured between the p-type substrate 11 that can be regarded as having the same potential as that of the platinum electrode plate and the $n^-$ layer 12. When this reverse bias voltage is ensured, the depletion layer between the gauge forming region 122 or remaining portion 123 and the p-type substrate 11 is sufficiently extended to the side of the p-type substrate 11. As a result, the electrochemical etching substantially ceases to proceed at the ends of the depletion layer in the p-type substrate 11, with the result that the bottom surface 81 of the recess portion 8 is kept out of contact with the gauge forming region 122.

That is, when the etching reaches the depletion layer, an anode oxide film (not illustrated) is formed to remarkably decrease the etching rate. Therefore, the etching ceases to proceed at the ends of this depletion layer.

However, this reverse bias voltage is needed to be made higher than the voltage which at an actual operation time (at the sensor operation time) is applied to the n-type gauge forming region 122.

The reason for this is that when the depletion layer that extends from the PN junction between the $n^-$ layer 12 and the substrate 11 has reached the surface of the substrate 11 that is exposed to the recess portion 8 at the actual operation time, there occurs the leakage current. To prevent this, the substrate 11 is needed to have a thickness that is large enough to prevent the depletion layer from reaching the surface of the substrate 11 exposed to the recess portion 8 at the actual operation time.

As illustrated in FIG. 13, a small groove 401 is formed at the lower part of each of the $p^+$ isolation regions 13 on the surface 11a of the thinned portion of the substrate 11 that has been thinned due to the electrochemical etching for the formation of the recess portion 8.

Next, as illustrated in FIGS. 3 and 4, after removing the unnecessary materials such as the nitride film, a resist film is coated on the surface of the wafer and this resist film is opened at a zone above the recess portion 8 by photolithography. Performing dry etching by using this resist film as a mask, there are formed the isolation grooves 3 communicating with the recess portion 8.

It is to be noted that, in this embodiment, by bringing the $p^+$ isolation region 13 and isolation groove 3 into positional alignment with each other with part of the $p^+$ isolation region 13 being caused to remain, the small groove 401 is decreased by the isolation groove 3. Of course, dry etching is not performed with respect to the zone that is above the recess portion 8 at which the beam portion 4 is to be formed, to thereby ensure the integrity of the beam portion 4.

Next, this resist film is removed and the resulting wafer is bonded to a pedestal and finally dicing is performed with respect thereto to thereby form a chip.

Another important point of this embodiment lies in that the isolation grooves 3 are formed while the p⁺ isolation regions 13 are left on both lateral sides of the beam portion 4. When etching has reached the depletion layer formed by the PN junction between the gauge forming region 122 and the substrate 11, the etching has not yet reached the depletion layer formed by the PN junction between the p⁺ isolation region 13 and the gauge forming region 122. As a result, the anisotropic small groove 401 (see FIG. 13) is further formed in the p⁺ isolation region 13 with the depletion layer formed by the PN junction between the gauge forming region 122 and the substrate 11, serving as the mask. When the thickness of the beam portion 4 is locally decreased by this small groove 401, this causes a decrease in the strength, variation in the sensitivity, etc. and therefore it is preferable that such small groove 401 be removed as much as possible.

A further detailed explanation will now be given with reference to FIGS. 15 and 16.

Figure 15:
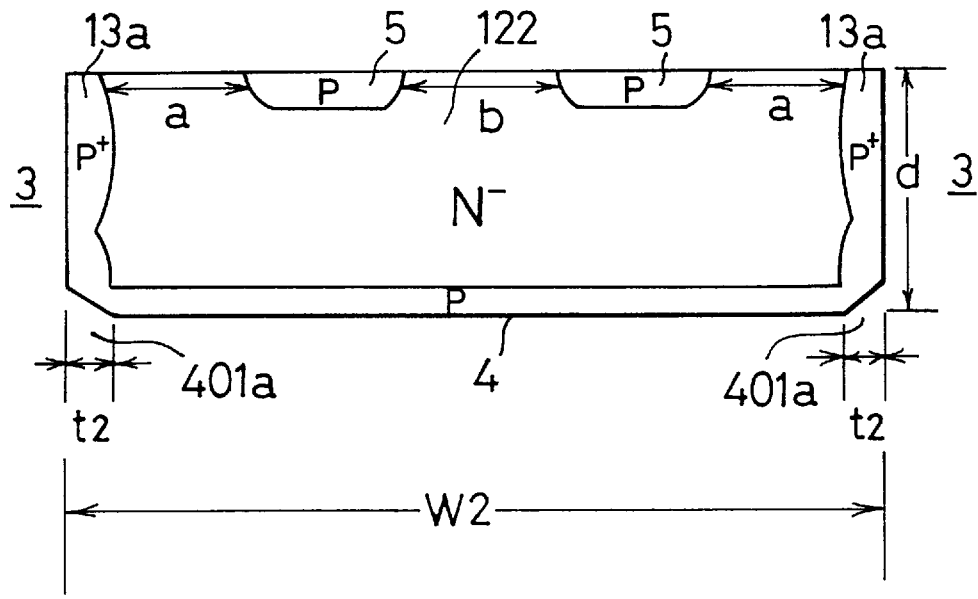
FIG. 15 is a sectional view of a beam portion to illustrate the operation and effect of the sensor according to the first embodiment.
Figure 16:
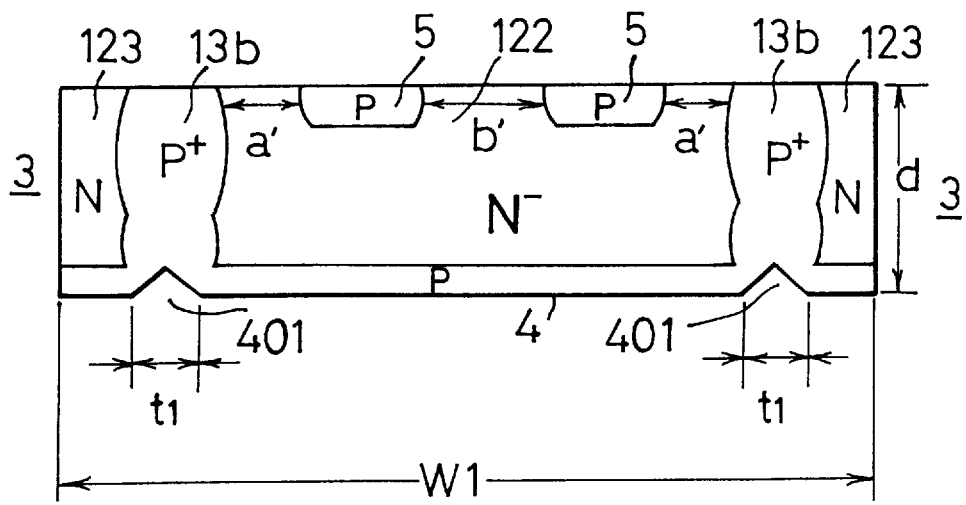
FIG. 16 is a sectional view of the beam portion to illustrate the operation and effect of the sensor according to another modification of the first embodiment.

FIGS. 15 and 16 are each a sectional view that is similar to that of the beam portion 4 which is taken along the line IV—IV of FIG. 2. FIG. 15 illustrates the beam portion 4 wherein the isolation grooves 3 have been formed by etching a part of the p⁺ isolation region 13a in the same way as in FIG. 4. FIG. 16 illustrates the beam portion 4 wherein the isolation grooves 3 have been formed by further etching the remaining portions 123 of the n-type layer that are situated at the positions that are further outward from the p⁺ isolation regions 13b.

In these beam portions 4, when trying to make the widths W1 and W2 of the beam portions 4 equal to each other, the distance (a) between the p⁺ isolation region 13a and p-type gauge region 5 illustrated in FIG. 15 and the distance (b) between the p-type gauge regions 5 illustrated in FIG. 15 can be made to have values, respectively, which are greater than those of the distance (a') between the p⁺ isolation region 13b and p-type gauge region 5 illustrated in FIG. 16 and the distance (b') between the p-type gauge regions 5 illustrated in FIG. 16.

Accordingly, since the distances between the respective p-type regions (p⁺ isolation regions 13 and p-type gauge regions 5) can be set to be larger when the p⁺ isolation region 13 is formed in such a manner as to face the isolation groove 3 of the beam portion 4 than when the p⁺ isolation region 13 is formed inside the beam portion 4, not only is the degree of freedom for design or the degree of freedom for fixation in a process such as mask alignment increased but also miniaturization is realized more advantageously.

Also, since the portions of the beam portion 4 where the small grooves 401 and 401a are formed become thinner than the remaining portion thereof having a thickness (d), there arises the problem that the strength of the beam portion 4 decreases or the variations in the sensitivity occur. On this account, as illustrated in FIG. 15, by etching and removing part of the region having the small groove 401 formed therein, it is possible to decrease the small groove 401 that is thinner than the beam portion 4 having the thickness (d) and thereby suppress the decrease in the strength and the occurrence of the sensitivity variation.

What is claimed is:

1. A semiconductor strain sensor comprising:

a main portion having a first conductivity type semiconductor substrate and a second conductivity type semiconductor region on a surface thereof;

a mass portion;

a beam portion connecting the main portion and the mass portion, the beam portion being formed by thinning the first conductivity type semiconductor substrate of said main portion from an opposite surface to the surface on which the second conductivity type semiconductor region is formed so that the beam portion is made up of a thinned first conductivity type semiconductor substrate and the second conductivity type semiconductor region;

a first conductivity type gauge portion in a gauge forming region in the second conductivity type semiconductor region of the beam portion; and a first conductivity type isolation region on an entire side peripheral surface of the gauge forming region which includes a side surface portion facing an isolation groove between the main portion and the mass portion, said first conductivity type isolation region having a depth reaching the first conductivity type semiconductor substrate, thereby preventing a pn junction between the first conductivity type semiconductor substrate and the second conductivity type region in which the first conductivity type gauge portion is formed from being exposed to a surface of said isolation groove.

2. A semiconductor strain sensor as set forth in claim 1, wherein the isolation groove penetrates the main portion to form the mass portion isolated from the main portion.

3. A semiconductor strain sensor as set forth in claim 1, wherein the isolation region is exposed to the surface of the isolation groove at side surfaces of the beam portion.

4. A semiconductor strain sensor as set forth in claim 1, further comprising a processing circuit portion, in the second conductivity type semiconductor region of the main portion, for processing an output signal from the first conductivity type gauge portion.

5. A semiconductor strain sensor as set forth in claim 1, wherein a thickness of the thinned first conductivity type semiconductor substrate is thicker than a depletion layer extending from a PN junction between the second conductivity type semiconductor region and the first conductivity type semiconductor substrate when a rated voltage is applied between the first conductivity type semiconductor substrate and the second conductivity type semiconductor region defining the gauge forming region.

* * * * *